(12) United States Patent
Hirai et al.

(10) Patent No.: US 9,904,385 B2
(45) Date of Patent: Feb. 27, 2018

(54) METHOD OF FABRICATING TOUCH SCREEN PANEL

(71) Applicant: SAMSUNG DISPLAY CO., LTD., Yongin-si, Gyeonggi-do (KR)

(72) Inventors: Akira Hirai, Yongin-si (KR); Mikiya Itakura, Yongin-si (KR); Dong Ho Lee, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 206 days.

(21) Appl. No.: 15/096,543

(22) Filed: Apr. 12, 2016

(65) Prior Publication Data

US 2016/0224143 A1   Aug. 4, 2016

Related U.S. Application Data

(62) Division of application No. 13/137,811, filed on Sep. 14, 2011, now abandoned.

(30) Foreign Application Priority Data

Sep. 29, 2010   (KR) ........................ 10-2010-0094224

(51) Int. Cl.
*H01K 3/10* (2006.01)
*G06F 3/041* (2006.01)
(Continued)

(52) U.S. Cl.
CPC .............. *G06F 3/041* (2013.01); *G06F 3/044* (2013.01); *H05K 1/117* (2013.01); *H05K 3/1275* (2013.01);
(Continued)

(58) Field of Classification Search
CPC ......... G06F 2203/04103; G06F 3/0416; G06F 3/0414; G06F 1/16; G02F 1/13338;
(Continued)

(56) References Cited

U.S. PATENT DOCUMENTS 8,111,344 B2 *   2/2012   Moon ................. G02F 1/13624
345/175
8,339,527 B2   12/2012   Lee et al.
(Continued)

FOREIGN PATENT DOCUMENTS

CN   101146406 A   3/2008
CN   101639580 A   2/2010
(Continued)

OTHER PUBLICATIONS

Chinese Office Action dated May 3, 2016 in Corresponding Chinese Patent Application No. 201110293898.2.
(Continued)

*Primary Examiner* — Thiem Phan
(74) *Attorney, Agent, or Firm* — Lee & Morse, P.C.

(57) ABSTRACT

A touch screen panel includes a film substrate defined by a touch active area and a non-touch active area and the touch area is arranged outside the touch active area. The touch screen panel includes a plurality of sensing electrodes arranged in the touch active area on an upper surface and a lower surface of the film substrate, and outer lines arranged in the non-touch active area on the upper and the lower surfaces of the film substrate. The outer lines are connected to the sensing electrodes along one of a first direction and a second direction, and the outer lines include a transparent electrode layer and a plating layer on the transparent electrode layer.

9 Claims, 5 Drawing Sheets

(51) Int. Cl.
*G06F 3/044* (2006.01)
*H05K 1/11* (2006.01)
*H05K 3/24* (2006.01)
*H05K 3/12* (2006.01)
*H05K 3/18* (2006.01)
*H05K 3/42* (2006.01)

(52) U.S. Cl.
CPC .............. *H05K 3/18* (2013.01); *H05K 3/243* (2013.01); *H05K 3/42* (2013.01); *G06F 2203/04103* (2013.01); *H05K 3/244* (2013.01); *H05K 2201/0108* (2013.01); *H05K 2201/0326* (2013.01); *H05K 2201/0949* (2013.01); *H05K 2203/0361* (2013.01); *H05K 2203/0574* (2013.01); *Y10T 29/49155* (2015.01); *Y10T 29/49165* (2015.01)

(58) Field of Classification Search
CPC ............ G02F 1/155; G09G 2300/0426; Y10T 29/49155; Y10T 29/49165; H03K 2217/96023; H05K 2201/0108
USPC ................... 29/852, 825, 829.83, 846, 849
See application file for complete search history.

(56) References Cited

U.S. PATENT DOCUMENTS

| 9,360,969 | B2* | 6/2016 | Lee ..................... G06F 3/044 |
| 2010/0026661 | A1 | 2/2010 | Teramoto |
| 2010/0295818 | A1 | 11/2010 | Lin et al. |
| 2011/0032207 | A1 | 2/2011 | Huang et al. |
| 2011/0099805 | A1 | 5/2011 | Lee |
| 2011/0109583 | A1 | 5/2011 | Lee |
| 2012/0038564 | A1 | 2/2012 | Kim et al. |
| 2012/0073947 | A1 | 3/2012 | Sakata et al. |

FOREIGN PATENT DOCUMENTS

| JP | H 10-190220 A | 7/1998 |
| JP | 2008-009921 A | 1/2008 |
| JP | 2010-072584 A | 4/2010 |
| JP | 2011-060146 A | 3/2011 |
| KR | 2002-0011716 A | 2/2002 |
| KR | 10-0813888 B1 | 3/2008 |
| KR | 10-0901350 B1 | 6/2009 |
| KR | 10-0909265 B1 | 7/2009 |
| KR | 2010 054673 A | 5/2010 |
| TW | M 354807 U | 4/2009 |
| WO | WO 2010/056055 A2 | 5/2010 |
| WO | WO 2010/095797 A1 | 8/2010 |
| WO | WO 2010/095798 A1 | 8/2010 |

OTHER PUBLICATIONS

Korean Office Action dated May 17, 2016 in Corresponding Korean Patent Application No. 10-2010-0094224.
Japanese Office Action dated Dec. 2, 2014 for JP 2011-003202; Akira Hirai, et al.
Japanese Office Action dated Aug. 25, 2015 for JP 2011-003202; Akira Hirai, et al.
Chinese Office Action dated Sep. 2, 2015 in Corresponding Chinese Patent Application No. 201110293898.2.
Taiwanese Office Action dated Dec. 8, 2015 for TW 100134474; Akira Hirai, et al.

* cited by examiner

METHOD OF FABRICATING TOUCH SCREEN PANEL

CROSS REFERENCE TO RELATED APPLICATION

This is a divisional application based on pending application Ser. No. 13/137,811, filed Sep. 14, 2011, the entire contents of which is hereby incorporated by reference.

BACKGROUND

1. Field

Embodiments relate to a touch screen panel and a fabricating method thereof, and more particularly, to a double-faced film touch screen panel and a fabricating method thereof, in which sensing electrodes for touch sensing and outer lines are formed on both surfaces of the a film substrate.

2. Description of the Related Art

A touch screen panel is an input device that may be capable of allowing a user's instruction to be input by, e.g., a selection instruction content displayed on a screen of a display device or the like with, e.g., a user's hand or an object.

The touch screen panel may be formed on, e.g., a front face of the display device. The touch screen panel may convert a contact position thereon into an electrical signal. For example, the user's hand or an object may contact the touch screen panel at the contact position. The selection instruction content selected at the contact position of the touch screen panel may be input as an input signal to the display device. A touch screen panel can be substituted for, e.g., a separate input device connected to a display device, such as a keyboard or mouse. Accordingly, application fields for touch screen panels have been gradually extended.

SUMMARY

Embodiments are directed to a touch screen panel and a method of manufacturing a touch screen panel.

Embodiments may be realized by providing a double-faced film touch screen panel and a fabricating method thereof, in which sensing electrodes for touch sensing and outer lines are formed on both surfaces of a film substrate, so that it is possible to reduce a dead-space and to form low-resistance lines through a simple process.

According to exemplary embodiments, there is provided a touch screen panel including a film substrate defined by a touch active area and a non-touch active area formed at the outside of the touch active area, a plurality of sensing electrodes arranged in the touch active area on upper and lower surfaces of the film substrate, and outer lines formed in the non-touch active area on the upper and lower surfaces of the film substrate. The outer lines are connected to the sensing electrodes along a first or second direction. The outer lines include a transparent electrode layer and a plating layer formed on the transparent electrode layer.

The sensing electrodes may be configured as a transparent electrode layer formed of the same material in the same layer as the transparent electrode layer of the outer lines.

The plating layer may be made of at least one of copper, nickel, gold, silver, palladium and alloy thereof.

A plurality of via holes that connect the upper and lower surfaces of the film substrate to each other by a conductive material grown on inner walls thereof may be formed at one side of the film substrate.

Each of the outer lines formed on one of the upper and lower surfaces of the film substrate may be connected to a pad portion formed on the other surface of the film substrate through the via hole.

The outer lines may further include a metal thin-film layer positioned between the transparent electrode layer and the plating layer.

The thickness of the metal thin-film layer may be formed thicker than that at which light is shielded.

The film substrate may be a cyclo olefin polymer (COP) substrate.

Embodiments may also be realized by providing a fabricating method of a touch screen panel. The method includes preparing a film substrate defined by a touch active area and a non-touch active area formed at the outside of the touch active area, substantially entirely forming a transparent electrode layer on both surfaces of the film substrate, and simultaneously patterning the transparent electrode layer on both the surfaces of the film substrate, thereby forming a plurality of sensing electrodes in the touch active area and forming outer lines connected to the sensing electrodes along a first or second direction in the non-touch active area. In the forming of the sensing electrodes and the outer lines, a plating layer is formed on the transparent electrode layer that constitutes lower electrodes of the outer lines before or after the transparent electrode layer is patterned.

The forming of the sensing electrodes and the outer lines may include coating a photoresist on both the surfaces of the film substrate, on which the transparent electrode layer is entirely formed, and then patterning the photoresist. The method may include forming a mask for plating, which covers the touch active area, on both the surfaces of the film substrate. The method may include forming the plating layer on the transparent electrode layer exposed in the non-touch active area on both the surfaces of the film substrate. The method may include removing the photoresist formed in the non-touch active area on both the surfaces of the film substrate and the mask for plating in the touch active area. The method may include simultaneously patterning the transparent electrode layer on both the surfaces of the film substrate. The method may include removing the photoresist formed in the touch active area on both the surfaces of the film substrate.

The forming of the sensing electrodes and the outer lines may include coating a photoresist on both the surfaces of the film substrate, on which the transparent electrode layer is entirely formed, patterning the photoresist and then patterning the transparent electrode layer using the patterned photoresist as a mask; removing the photoresist on both the surfaces of the film substrate; and forming the plating layer on the transparent electrode layer patterned in the non-touch active layer on both the surfaces of the film substrate.

In the forming of the sensing electrodes and the outer lines, the transparent electrode layer on both the surfaces of the film substrate may be simultaneously patterned using a photolithography or printing technique.

The method may further include substantially entirely forming a metal thin-film layer on the transparent electrode layer prior to the patterning of the transparent electrode layer, after the transparent electrode layer is substantially entirely formed on both the surfaces of the film substrate.

The forming of the sensing electrodes and the outer lines by simultaneously patterning the transparent electrode layer on both the surfaces of the film substrate may further include patterning the metal thin-film layer.

The patterning of the metal thin-film layer may further include removing the metal thin-film layer on the sensing electrodes, after the transparent electrode layer and the metal thin-film layer are patterned.

The method may further include forming a plurality of via holes that pass through the film substrate at one side of the film substrate corresponding to the non-touch active area.

In one or more of the forming of the transparent electrode layer and the forming of the plating layer, one or more of the transparent electrode layer and the plating layer may be grown on inner walls of the via holes so that the upper and lower surfaces of the film substrate are connected to each other through the via holes.

As described above, according to exemplary embodiments, it is possible to provide a light, thin, double-faced film touch screen panel and a fabricating method thereof, in which sensing electrodes for touch sensing and outer lines connected to the sensing electrodes are distributedly formed on both surfaces of a film substrate, so that it is possible to reduce a dead space and to implement a high-precision large-sized touch screen panel.

Also, low-resistance outer lines can be formed through a low-cost simple process of patterning a transparent electrode layer in a line area (area in which outer lines are arranged in the dead space) on both the surfaces of the film substrate using a photoresist through a patterning or printing technique or the like and then plating the top of the patterned transparent electrode layer. Accordingly, it is possible to provide a double-faced film touch screen panel and a fabricating method thereof, capable of enhancing fabrication efficiency and improving characteristics.

Via holes may be formed on one side of the film substrate, a pad portion formed on one surface of the film substrate are connected to the outer lines formed on the other surface of the film substrate through the via holes, so that the pad portion can be formed on only one surface of the film substrate. Accordingly, it may be possible to provide a double-faced film touch screen panel and a fabricating method thereof, in which the touch screen panel is connected to an external circuit using one flexible printed circuit board, so that the connection structure of the external circuit can be simplified.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
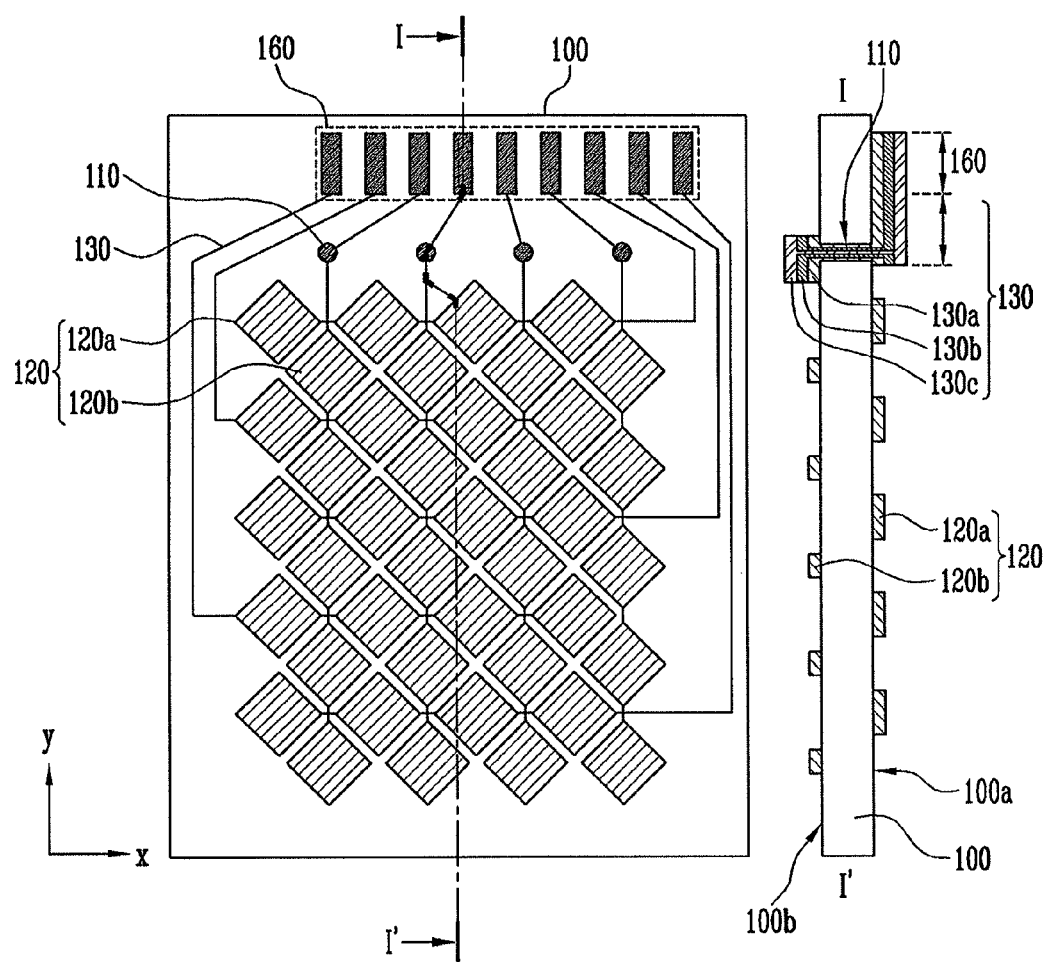
FIG. 1 illustrates a schematic plan view of a touch screen panel and a sectional view corresponding to the plan view taken along line I-I' of the schematic plan view, according to an exemplary embodiment.

Korean Patent Application No. 10-2010-0094224, filed on Sep. 29, 2010, in the Korean Intellectual Property Office, and entitled: "Touch Screen Panel and Fabricating Method Thereof" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the following detailed description, only certain exemplary embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the other element or may be indirectly on the other element with one or more intervening elements interposed therebetween. Also, when an element is referred to as being "connected to" another element, it can be directly connected to the other element or be indirectly connected to the other element with one or more intervening elements interposed therebetween. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Hereinafter, like reference numerals refer to like elements.

Hereinafter, exemplary embodiments will be described in detail with reference to the accompanying drawings.

FIG. 1 illustrates a schematic plan view of a touch screen panel and a sectional view corresponding to the plan view according to an exemplary embodiment.

Referring to FIG. 1, the touch screen panel according to this embodiment may include a transparent film substrate 100 and a plurality of sensing electrodes 120. The touch screen panel may include a plurality of outer lines 130 that are distributed, e.g., in a predetermined pattern, on at least one of upper and lower surfaces 100a and 100b of the film substrate 100. The outer lines 130 may include a transparent electrode layer 130a and a plating layer 130c formed on the transparent electrode layer 130a. The outer lines 130 may be formed using, e.g., a plating technique.

The film substrate 100 may be formed of a transparent film material that has, e.g., high transparency and/or heat resistance to endure a high temperature process, and does not generate oligomer. For example, the film substrate 100 may be formed as a cyclo olefin polymer (hereinafter, referred to as a COP) substrate. However, embodiments of the film substrate 100 are not limited to the COP substrate. For example the film substrate 100 may include various substrate materials, e.g., a transparent substrate material.

A touch active area and a non-touch active area may be defined in the film substrate 100. In the touch active area, the sensing electrodes 120 may be arranged to recognize a touch input. The non-touch active area may be a dead-space area formed at the outside of the touch active area. For example, the non-touch active area may surround the touch active area. At least portions of the outer lines 130, a pad portion 160, and/or the like may be arranged in the non-touch active area of the film substrate 100.

Referring to FIG. 1, the sensing electrodes 120 may be arranged to be alternately distributed, e.g., in a predetermined pattern that includes staggered rows of sensing electrodes 120, in the touch active area of the film substrate 100. The sensing electrodes 120 may be alternately distributed with respect to both sides of the upper and lower surfaces 100a and 100b of the film substrate 100. The sensing electrodes 120 may be implemented as transparent electrode patterns such as indium tin oxide (ITO) and/or indium zinc oxide (IZO) patterns.

The sensing electrodes 120 may include a plurality of first sensing electrodes 120a connected along a first direction (e.g., an X-axis direction) for each line so as to detect a coordinate for a touch input, and a plurality of second sensing electrodes 120b connected along a second direction (e.g., a Y-axis direction) intersected with the first direction for each line.

According to an exemplary embodiment, the sensing electrodes 120 may be distributed in the touch active area on the upper and lower surfaces 100a and 100b. The first sensing electrodes 120a may be arranged on the upper surface 100a of the film substrate 100, and the second sensing electrodes 120b may be arranged on the lower surface 100b of the film substrate 100. Accordingly, the touch screen panel of this embodiment may be implemented as a double-faced film touch screen panel.

At least portions of the outer lines 130 may be arranged in the non-touch active area defined as a dead space so as to be connected to the sensing electrodes 120 along at least one of the first and second directions. For example, the outer lines 130 may be connected to lines of the sensing electrodes 120 along the first direction, e.g., the x-axis direction.

Similar to the sensing electrodes 120, the outer lines 130 may be distributed, e.g., in a predetermined pattern, on the upper and lower surfaces 100a and 100b of the film substrate 100. For example, the outer lines 130 may be distributedly formed at least in the non-touch active area on the upper and lower surfaces 100a and 100b of the film substrate 100.

According to an exemplary embodiment, some outer lines may be connected to the first sensing electrodes 120a arranged on the upper surface 100a of the film substrate 100. These outer lines may be formed together with the first sensing electrodes 120a on the upper surface 100a of the film substrate 100. Other outer lines may be connected to the second sensing electrodes 120b arranged on the lower surface 100b of the film substrate 100. These other outer lines may be formed together with the second sensing electrodes 120b on the lower surface 100b of the film substrate 100.

The outer lines 130 may include at least the transparent electrode layer 130a and the plating layer 130c formed on the transparent electrode layer 130a. The outer lines 130 may be formed using, e.g., a plating technique. For example, in an exemplary process of entirely growing a preliminary transparent electrode layer and then patterning the preliminary transparent electrode layer to form, e.g., the sensing electrodes 120, the transparent electrode layer 130a in the non-touch active area may also be patterned to correspond to a layer of the outer lines 130. The plating layer 130c may then be formed on the transparent electrode layer 130a in the non-touch active area, thereby forming the outer lines 130. Before the transparent electrode layer is patterned posterior to the growing of the transparent electrode layer, the plating layer 130 may be partially formed on only the transparent electrode layer 130a of, e.g., an area in which the outer lines 130 is to be formed, using a mask. In this case, the sensing electrodes 120 may include, e.g., a transparent electrode layer formed of, e.g., the same material and/or in the same layer as the transparent electrode layer 130a of the outer lines 130.

The plating layer 130c of the outer lines 130 may be made of at least one of copper, nickel, gold, silver, palladium, and an alloy thereof. For example, the plating layer 130c may be formed by plating an alloy of copper and/or nickel-gold on the transparent electrode layer 130a in the non-touch active layer, or the like.

If the plating layer 130c is formed on the transparent electrode layer 130a, it is possible to implement low-resistance outer lines 130. Without intending to be bound by this theory, if the plating layer 130c is formed using the plating technique, a conductive layer having a thickness of about 10 to 100 times thicker than, e.g., a vacuum layer or the like, can be easily formed at low cost. Accordingly, the width of lines can be decreased, so that it is possible, e.g., to reduce a dead space and/or to implement a high-precision large sized touch screen panel.

The transparent electrode layer 130a for forming the outer lines 130 and the sensing electrodes 120 may be simultaneously formed together. Such that the transparent electrode layer 130a is included in both the outer lines 130 and the sensing electrodes 120, e.g., as a lower layer of a stacked structure. The transparent electrode layer 130a may be simultaneously patterned on both surfaces of the film substrate 100. Further, when the plating layer 130c is formed on the transparent electrode layer 130a for forming the outer lines 130, a plating process can be simultaneously performed on both the surfaces of the film substrate 100.

In the fabrication of the double-faced film touch screen panel according to an exemplary embodiment, the sensing electrodes 120 and the outer lines 130 may be distributed on both the upper and lower surfaces 100a and 100b of the film substrate 100. The sensing electrodes 120 and the outer lines 130 may be simultaneously formed and patterned on the upper and lower surfaces 100a and 100b of the film substrate 100.

The sensing electrodes 120 and the transparent electrode layer 130a of the outer lines 130 may be patterned using, e.g., a photolithography technique of forming a photoresist on both surfaces. The photolithography technique may include light-exposing the photoresist, or the like. In this case, a metal thin-film layer 130b that serves as a light-shielding layer. For example, the metal thin-film layer 130b may be formed between the transparent electrode layer 130a and the plating layer 130c. Without intending to be bound by this theory, the metal thin-film layer 130b may be further formed on the transparent electrode layer 130a so as assist in simultaneously performing light-exposure on both the upper and lower surfaces 100a and 100b.

Accordingly to an exemplary embodiment, the plating process may be performed after the metal thin-film layer 130b is formed, as such the metal thin-film layer 130b may be formed before the plating layer 130c. Further, in a product state the metal thin-film layer 130b may be positioned between the transparent electrode layer 130a and the plating layer 130c. That is, in addition to the transparent electrode layer 130a and the plating layer 130c, the outer lines 130 may further include the metal thin-film layer 130b positioned between the transparent electrode layer 130a and the plating layer 130c. The metal thin-film layer 130b formed on the sensing electrodes 120 may be removed during the fabrication process. Therefore, in the product state the metal thin-film layer 130b may not exist in the touch active area.

According to an exemplary embodiment, it may be sufficient that the thickness of the metal thin-film layer 130b is correspondingly greater than a minimum thickness that at which light is effectively shielded. The thickness of the metal thin-film layer 130b may be less than a thickness that at which the metal thin-film layer 130b is configured to be used for lines.

The metal thin-film layer 130b is not necessarily provided to simultaneously perform light-exposure on both the surfaces. The metal thin-film layer 130b may be omitted according to the kind of photoresist, the patterning technique, and/or the like. For example, in a case where a photolithography process is performed using a black photoresist for shielding light or where the sensing electrodes 120 and the transparent electrode layer 130a of the outer lines 130 are patterned using a printing technique or the like, the metal thin-film layer 130b may be omitted.

The outer lines 130 may be connected to a flexible printed circuit board (not shown) through the pad portion 160 so as to be, e.g., connected to an external driver circuit. If the outer lines 130 are equally distributed on the upper and lower surfaces 100a and 100b of the film substrate 100, the flexible printed circuit board may need to be connected to the respective upper and lower surfaces 100a and 100b of the film substrate 100. Hence, the connection structure of an external circuit may be complicated and fabrication cost may be increased.

Without intending to be bound by this theory, to address the problem of complicated connection structure, a plurality of via holes 110 may be formed through the film substrate 100. The plurality of via holes 110 may be previously formed at one side of the film substrate 100 before a process of forming the outer lines 130. A conductive material may be grown on inner walls of the via holes in a processes of forming one or more of the transparent electrode layer 130a, the metal thin-film layer 130b, and the plating layer 130c. Accordingly, the plurality of via holes 110 may have disposed therein a stacked structure having same constitution of layers as the outer lines 130. The plurality of via holes 110 may be filled during the process of forming the outer lines 130.

The plurality of via holes 110 may be filled during the process of forming the outer lines 130. For example, the plurality of via holes 110 may connect the upper and lower surfaces 100a and 100b of the film substrate 100 to each other and may be formed by the conductive material grown on the inner walls of the via holes 110, e.g., through the film substrate 100 at one side of the film substrate 100.

According to an exemplary embodiment, the via holes 110 may be connected to the outer lines 130 formed on one of the upper and lower surfaces 100a and 100b of the film substrate 100. The via holes 110 may connect the outer lines 130 to the pad portion 160 formed on the other of the upper and lower surfaces 100a and 100b of the film substrate 100. That is, each of the outer lines 130 may be formed on one of the upper and lower surfaces 100a and 100b of the film substrate 100, and the outer lines 130 may be connected to the pad portion 160 formed on the other of the upper and lower surfaces 100a and 100b through the via hole 110. For example, each of the outer lines 130 formed on the lower surface 100b of the film substrate 100 may be connected to the pad portion 160 formed on the upper surface 100a of the film substrate 100 through the via hole 110 that passes through the film substrate 100 and has the conductive material grown on the inner wall thereof.

Without intending to be bound by this theory, it is possible to implement a double-faced film touch screen panel in which the sensing electrodes 120 and the outer lines 130 are distributedly arranged on both upper and lower surfaces 100a and 100b of the film substrate 100. It is also possible to form the pad portion 160 on only one surface of the touch screen panel. Accordingly, the touch screen panel may be connected to an external circuit using one flexible printed circuit board, so that it is possible to simplify the connection structure of the external circuit and to reduce the fabrication cost.

Accordingly, it is possible to provide a light, thin, double-faced film touch screen panel and a fabricating method thereof, in which the sensing electrodes 120 for touch sensing and the outer lines 130 connected to the sensing electrodes 120 are distributedly formed on both surfaces of the film substrate 100. Further, it may be possible to reduce the dead space and/or to implement a high-precision large-sized touch screen panel.

The low-resistance outer lines 130 can be formed through a low cost, and simple process of patterning a transparent electrode layer in a line area, e.g., an area in which outer lines are arranged in the dead space, on both the surfaces of the film substrate 100. The low-resistance outer lines 130 may be formed using a photoresist through a patterning or printing technique and/or the like, and then plating the top of the patterned transparent electrode layer 130a. Accordingly, it is possible to provide a double-faced film touch screen panel and a fabricating method thereof, capable of enhancing fabrication efficiency and improving characteristics.

The via holes may be formed at one side of the film substrate 100. The pad portion 160 may be formed on one surface, e.g., the upper surface 100a, of the film substrate 100. The pad portion 160 can be formed on only one surface of the film substrate 100. The pad portion 160 may be connected to the outer lines 130 formed on the other surface, e.g., the lower surface 100b, of the film substrate 100 by way of the via holes 110. Accordingly, it is possible to provide a double-faced film touch screen panel and a fabricating method thereof, in which the touch screen panel is connected to an external circuit using one flexible printed circuit board (not shown), so that the connection structure of the external circuit can be simplified.

FIGS. 2A to 2L illustrate sectional views of a method of fabricating the touch screen panel shown in FIG. 1, according to an exemplary embodiment.

Figure 2A:
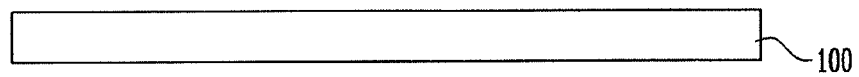
FIGS. 2A to 2L illustrate sectional views of a method of fabricating the touch screen panel shown in FIG. 1, according to an exemplary embodiment.
Figure 2B:
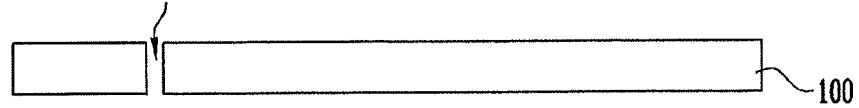
Figure 2C:
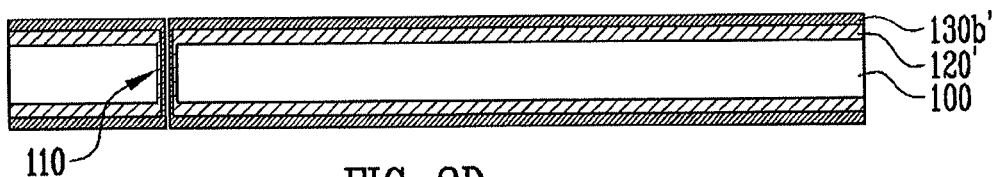

Referring to FIGS. 2A to 2L, the fabricating method of the touch screen panel includes preparing a film substrate 100 defined, e.g., as shown in FIG. 2A. The film substrate 100 may be prepared to have a touch active area and a non-touch active area formed at the outside of the touch active area. The film substrate 100 may include a via hole 110, e.g., as shown in FIG. 2B. As shown in FIG. 2C, a transparent electrode layer 120', e.g., a preliminary transparent electrode layer, may be substantially entirely formed on both surfaces of the film substrate 100 and in the via hole 110. For example, the transparent electrode layer 120' may be formed on substantially the entire surfaces of the film substrate 100, and may extend through the entire via hole 110. Optionally, the metal thin-film layer 130b may be substantially entirely formed on the transparent electrode layer 120'.

The transparent electrode layer 120' may be processed to form a plurality of sensing electrodes 120 in the touch active area and to form a plurality of outer lines 130 in the non-touch active area. The transparent electrode layer 120' may be simultaneously patterned on both the surfaces of the film substrate 100 to form the transparent electrode layer 130a.

In the forming of the sensing electrodes 120 and the outer lines 130, a plating layer 130c may be formed on the transparent electrode layer 130a. The plating layer 130c may constitute lower electrodes of the outer lines 130, e.g., before and/or after the transparent electrode layer 120' is patterned. Here, in the patterning of the transparent electrode layer 120', e.g., for forming the sensing electrodes 120 and the transparent electrode layer 130a that constitutes lower electrodes of the outer lines 130, the transparent electrode layer 120' may be simultaneously patterned on both the surfaces of the film substrate 100 through a photolithography or printing technique.

In order to simplify the connection structure to an external circuit, a plurality of via holes 110 through which both the surfaces of the film substrates of the film substrate 100 are connected to each other may be formed at one side of the film substrate 100.

More specifically, in order to fabricate the touch screen panel shown in FIG. 1, a film substrate 100 defined by a touch active area and a non-touch active area formed at the outside of the touch active area may be first prepared as shown in FIG. 2A. The film substrate 100 may include, e.g., a COP substrate that has high transparency and heat resistance and may not generate an oligomer. In addition, another transparent substrate material may be used.

Subsequently, as shown in FIG. 2B, a plurality of via holes 110 that pass through the film substrate 100 may be formed at one side of the film substrate 100 corresponding to the non-touch active area. The via holes 110 may be formed using laser, drill, and/or the like.

Subsequently, as shown in FIG. 2C, a transparent electrode layer 120' may be substantially entirely formed on both surfaces of the film substrate 100 having the via holes 110 formed therein. A metal thin-film layer 130b' may be substantially entirely formed on the transparent electrode layer 120'.

Here, the transparent electrode layer 120' may be used to form sensing electrodes positioned in the touch active area, and may be formed using a transparent electrode material such as ITO or IZO. The thickness of the transparent electrode layer 120' may be adjusted in consideration of sensor sensitivity and the like.

The metal thin-film layer 130b' may be used as a light-shielding layer in, e.g., a process of performing light-exposure simultaneously on both the surfaces and a shield layer in a process of plating. The thickness of the metal thin-film layer 130b' may be formed thicker than that at which light is shielded but formed thinner than that at which the metal thin-film layer may be used for lines.

The metal thin-film layer 130b' may be formed of, e.g., an Ag—Pd—Cu (hereinafter, referred to as APC) alloy, or the like. In addition to the APC alloy, the metal thin-film layer 130b' may be formed from materials that may be directly formed the transparent electrode layer 120' such as ITO. For example, the metal thin-film layer 130b' may be formed of at least one of molybdenum (Mo), chrome (Cr), aluminum (Al) alloy, and the like.

The metal thin-film layer 130b' may be to be removed from the touch active area in a subsequent process, it may be formed of a material that can be selectively etched with the material of the transparent electrode layer 120' such as ITO. The metal thin-film layer 130b' may be excluded or may be selective provided according to the kind of photoresist, the patterning technique, and the like.

In the forming of the transparent electrode layer 120' and/or the metal thin-film layer 130b' on both the surfaces of the film substrate 100, the transparent electrode layer 120' and/or the metal thin-film layer 130b' may be grown on inner walls of the via holes 110. Accordingly, the upper and lower surfaces of the film substrate 100 may be connected to each other through the via holes 110.

Figure 2D:
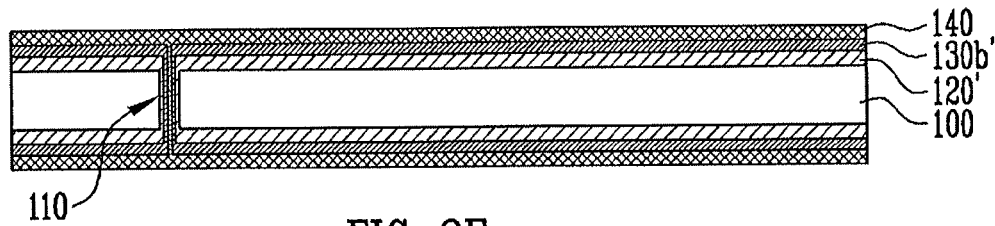

As shown in FIG. 2D, a photoresist 140 may be coated on both the surfaces of the film substrate 100, e.g., on which the transparent electrode layer 120' and the metal thin film layer 130' are entirely formed.

Figure 2E:
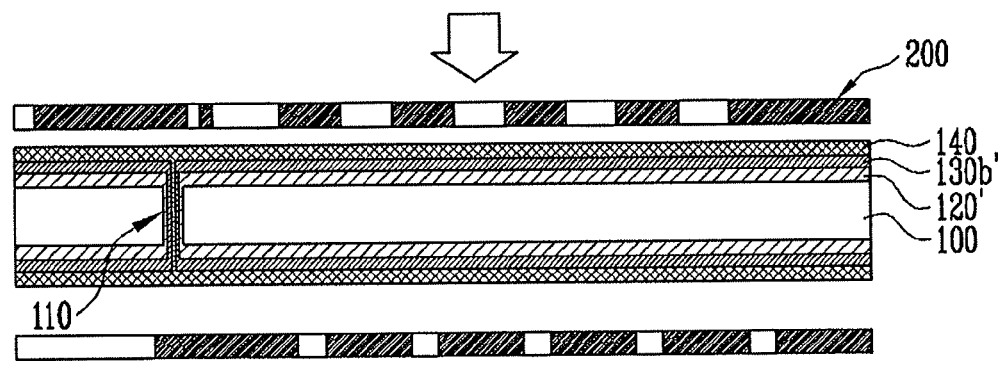
Figure 2E:

As shown in FIG. 2E, a mask 200 may be aligned above the photoresist 140. Light-exposure may be simultaneously performed on both the surfaces of the film substrate 100, thereby patterning the photoresist 140. In this embodiment, since the metal thin-film layer 130b' for shielding light is formed on both the surfaces of the film substrate 100, it is possible to perform the patterning of the photoresist 140 by performing light-exposure simultaneously on both the surfaces of the film substrate 100. In a case where the photoresist 140 made of a black matrix material for shielding light is used, the light-exposure can be simultaneously performed on both the surfaces of the film substrate 100 without forming the metal thin-film layer 130b'.

Figure 2F:
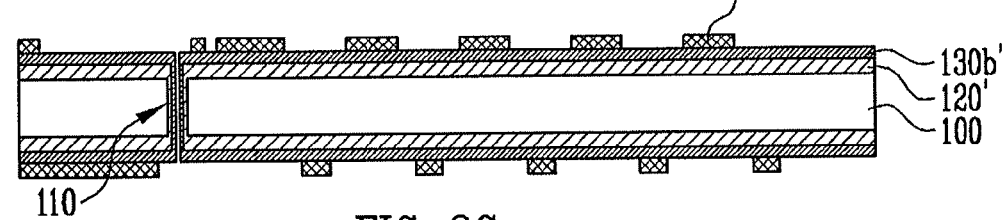

As shown in FIG. 2F, a plurality of patterned photoresist 140' may be positioned on the transparent electrode layer 120' and the metal thin-film layer 130'.

Figure 2G:
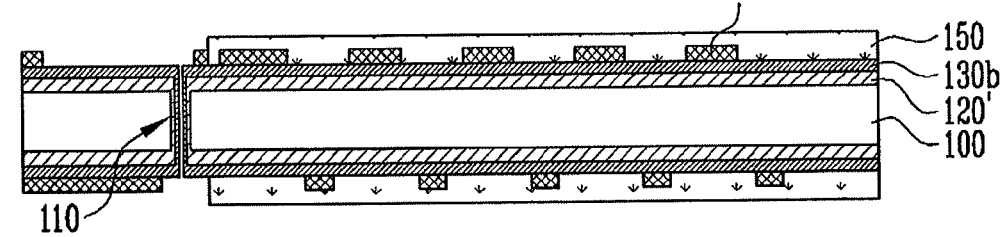

As shown in FIG. 2G, a mask 150 for plating. The mask 150 may cover the touch active area and may formed on both the surfaces of the film substrate 100.

Figure 2H:
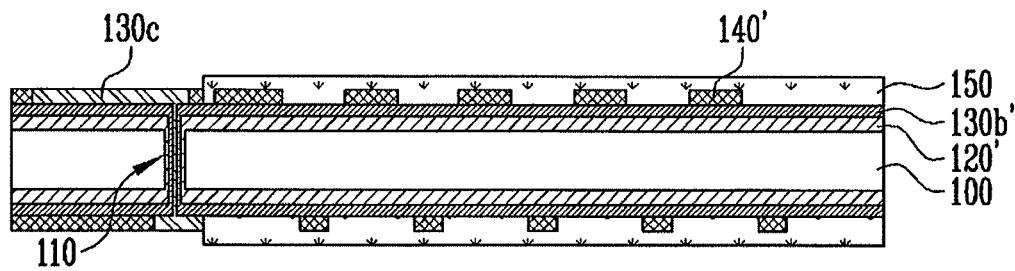

As shown in FIG. 2H, a plating layer 130c may be formed on the transparent electrode layer 120' and optionally the metal thin-film layer 130b', which are exposed in the touch active area on both the surfaces of the film substrate 100. The plating layer 130c may be formed using, e.g., a plating technique. The plating layer 130c may have a thickness of a few micrometers. The plating layer 130c may be formed on one region of the non-touch active area, e.g., the regions in which outer lines are to be formed, and in the inner walls of the via holes 110.

Figure 2I:
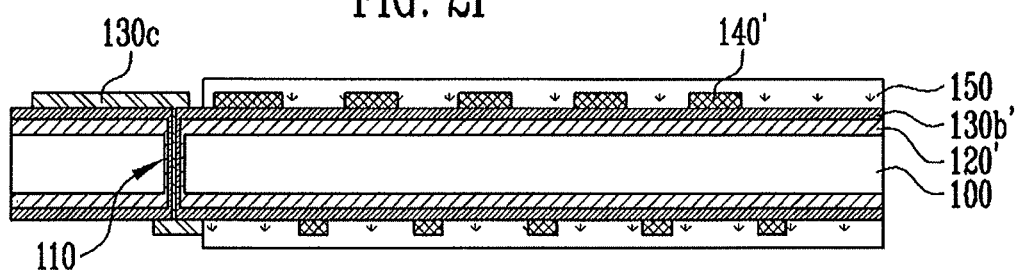
Figure 2J:
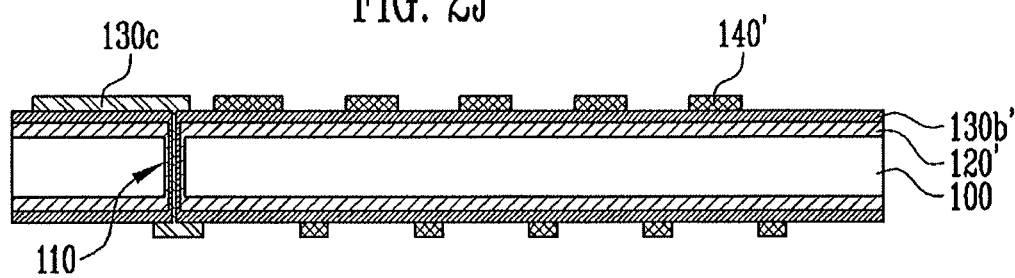

As shown in FIG. 2I, the photoresist 140' in the non-touch active area, e.g., the photoresist 140' surrounding the plating layer 130c, may be removed. As shown in FIG. 2J, the mask 150 for plating in the touch active area may removed.

Figure 2K:
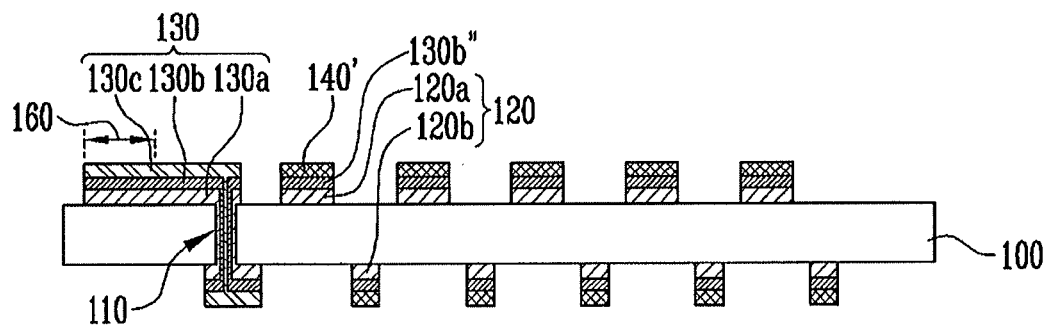

As shown in FIG. 2K, the transparent electrode layer 120' and the metal thin-film layer 130b' on both the surface of the film substrate 100 may be patterned. For example, through a wet etching technique using an etchant, or the like. In this instance, a wet etching process using an etchant for etching the metal thin-film layer 130b' may be performed separately from a wet etching process using an etchant for etching the transparent electrode layer 120'.

Figure 2L:
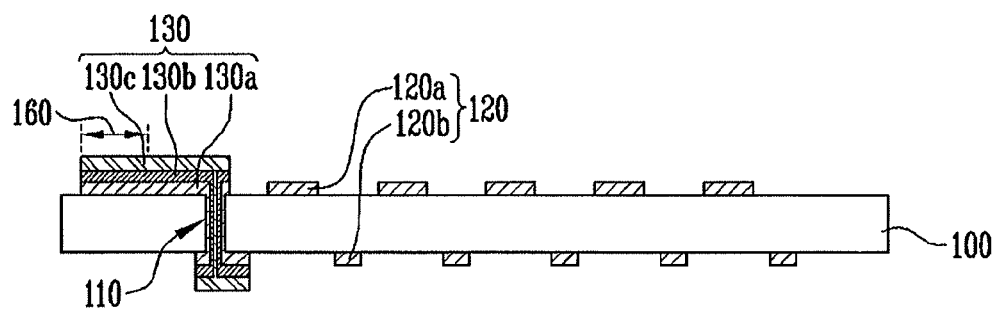

As shown in FIG. 2L, the photoresist 140' and the metal thin-film layer 130b'', which may be formed in the touch active area on both the surfaces of the film substrate 100, may all be removed. That is, the photoresist 140' and the metal thin-film layer 130b'' on sensing electrodes 120 may all be removed. However, the metal thin-film layer 130b under the plating layer 130c formed in the non-touch active area may not be removed. The metal thin layer 130b in the non-touch active area may constitute outer lines 130 together with the transparent electrode layer 130a and the plating layer 130c. The at least one of the transparent electrode layer 130a, the metal thin layer 130b, and the plating layer 130c may be disposed on sidewalls of the via hole 110.

According to the fabricating method of the touch screen panel described above, the sensing electrodes 120 and the outer lines 130 can be simultaneously formed on both surfaces of the film substrate 100, thereby simplifying fabricating processes.

Also, in the forming of the transparent electrode layer 120' and the plating layer 130c, a conductive material may be grown on the inner walls of the via holes 110 by previously forming the via holes 110 in the film substrate 100, so that both surfaces of the film substrate 100 can be connected to each other through a relatively simple process. Accordingly, it is possible to form a pad portion 160 on only one surface of the film substrate 100, thereby simplifying the connection structure to an external circuit.

Meanwhile, in a case where the COP substrate having low absorbing factor is used in the process using the plating technique, it is possible to achieve high reliability. Also, it is possible to achieve reliability of the via holes 110 and high reliability in a high-temperature process when components are mounted on the touch screen panel.

FIGS. 3A to 3G illustrate sectional views of a method of fabricating the touch screen panel shown in FIG. 1, according to an exemplary embodiment. For convenience of illustration, in descriptions of FIGS. 3A to 3G, detailed descriptions of parts (particularly, FIGS. 3A-3D) similar or identical to those of the embodiment showing in FIGS. 2A to 2L will be omitted, and sequences of the fabricating method will be briefly described.

Figure 3A:
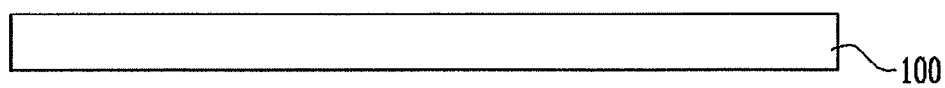
FIGS. 3A to 3G illustrate sectional views of a method of fabricating the touch screen panel shown in FIG. 1, according to an exemplary embodiment.
Figure 3B:
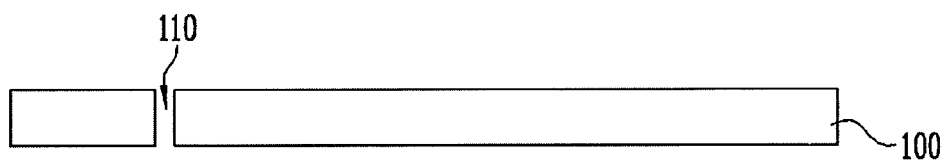
Figure 3C:
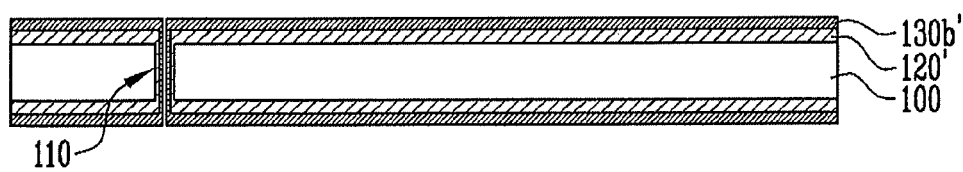
Figure 3D:
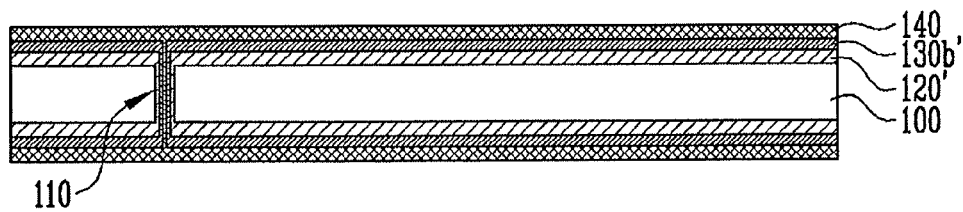

As shown in FIG. 3D, a photoresist 140 may be coated on both surfaces of a film substrate 100, on which a transparent electrode layer 120' and a metal thin-film layer 130b' are entirely formed.

Figure 3E:
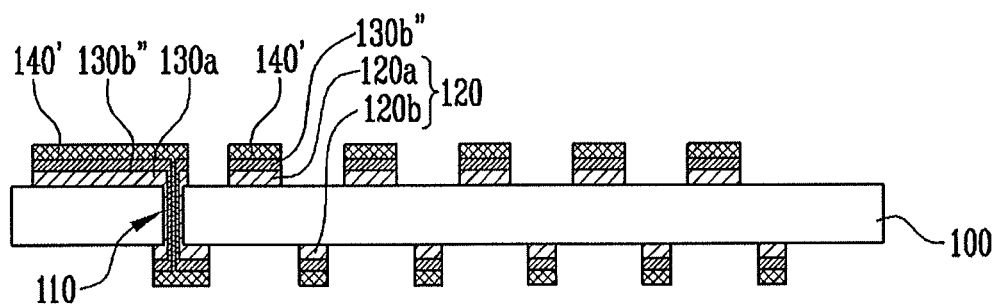

As shown in FIG. 3E, the photoresist 140 may be patterned. The transparent electrode layer 120' and the metal thin-film layer 130b' in both a touch active area and a non-touch active area may be patterned using the patterned photoresist 140' as a mask.

Figure 3F:
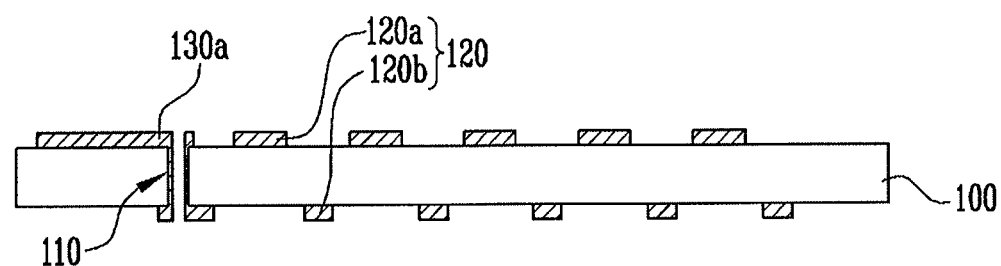
Figure 3G:
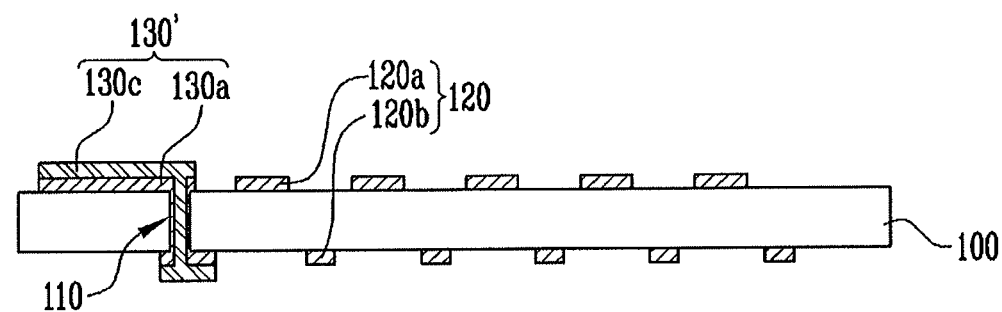

As shown in FIG. 3F, the photoresist 140' and the metal thin-film layer 130b'', which are patterned on both the surfaces of the film substrate 100, are removed. The metal thin-film layer 130b'' in the via hole 110 may also be removed. The sensing electrodes 120 and the transparent electrode layer 130a of outer lines may be left remaining, as shown in FIG. 3F. Then, the touch active area may be covered by a mask for plating (not shown). The top of the transparent electrode layer 130a, e.g., the transparent electrode layer of the outer lines, in the non-touch active area may be plated by the mask for plating. Accordingly, a plating layer 130c is formed on the top of the transparent electrode layer 130a patterned in the non-touch active layer on both the surfaces of the film substrate 100, thereby forming low-resistance outer lines 130' including the transparent electrode layer 130a and the plating layer 130c.

In the aforementioned embodiment shown in FIGS. 2A to 2L, and this embodiment shown in FIGS. 3A to 3G, the transparent electrode layer 130a and the like may be grown using a vacuum growing technique. The transparent electrode layer 130a may be patterned using the photolithography technique, thereby forming the sensing electrodes 120 and the transparent electrode layer 130a of the outer lines 130. However, the embodiments are not limited thereto. For example, the sensing patterns 120 and the transparent electrode layer 130a of the outer lines 130 may be immediately formed in patterns as shown in FIG. 3f using a printing technique. In this case, the processes can be more simplified, and the vacuum growing technique can be removed.

By view of summation and review, touch screen panels may be divided into a resistive overlay touch screen panel, a photosensitive touch screen panel, a capacitive touch screen panel, and the like. Among these touch screen panels, the capacitive touch screen panel may convert a contact position into an electrical signal by sensing a change in capacitance formed between a conductive sensing cell and an adjacent sensing electrode, ground electrode or the like when a user's hand or object is in contact with the touch screen panel. With the capacitive touch screen panel it may be possible to address the degradation of the image quality caused by an air layer that exists between two transparent substrates having upper and lower electrodes respectively formed, as associated with the resistive overlay touch screen panel.

For example, in a case where sensing electrodes provided to the capacitive touch screen panel are formed on one film substrate, a light and thin touch screen panel may be implemented while enhancing image quality as compared with the resistive overlay touch screen panel. However, in a case where all sensing electrodes and all outer lines connected to the sensing electrodes are formed on one surface of the film substrate, a dead-space, e.g., a black matrix area, having the outer lines arranged therein is increased. Therefore, it may be difficult to implement a high-precision large sized touch screen panel.

Accordingly, in exemplary embodiments, there are provided a double-faced film touch screen panel and a fabricating method thereof, in which sensing electrodes for touch sensing and outer lines are distributedly formed on both surfaces of a film substrate, so that it is possible to reduce a dead-space and to implement a high-precision large-sized touch screen panel. Furthermore, in exemplary embodiments, there are provided a double-faced film touch screen panel and a fabricating method thereof, in which low-resistance outer lines are formed through a relatively simple process, so that it is possible to enhance fabrication efficiency and to have enhanced characteristics.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. Further, it is to be understood that the invention is not limited to the disclosed embodiments, but, on the contrary, is intended to cover various modifications and equivalent arrangements included within the spirit and scope of the appended claims, and equivalents thereof

What is claimed is:

1. A fabricating method of a touch screen panel, the method comprising:

preparing a film substrate defined by a touch active area and a non-touch active area, the non-touch active area being formed outside of the touch active area;

forming a transparent electrode layer substantially entirely on both surfaces of the film substrate;

forming a plurality of sensing electrodes in the touch active area and forming outer lines connected to the sensing electrodes by simultaneously patterning the transparent electrode layer on both surfaces of the film substrate, the outer lines being formed along one of a first direction and a second direction in the non-touch active area; and substantially entirely forming a metal thin-film layer on the transparent electrode layer prior to the patterning of the transparent electrode layer, and after the transparent electrode layer is substantially entirely formed on both the surfaces of the film substrate, wherein, forming the sensing electrodes and forming the outer lines includes forming a plating layer on the transparent electrode layer that constitutes lower electrodes of the outer lines before or after the transparent electrode layer is patterned, and wherein the metal thin-film layer directly contacts the transparent electrode layer and the plating layer, and wherein:
a thickness of the metal thin-film layer is greater than a minimum thickness at which light is shielded, or
the metal thin-film layer is formed of:
an alloy of silver, palladium, and copper; or
at least one of molybdenum or aluminum alloy.

2. The method as claimed in claim 1, wherein forming the sensing electrodes and the forming of the outer lines includes:
coating a photoresist on both the surfaces of the film substrate having the transparent electrode layer substantially entirely formed thereon, and then patterning the photoresist;
forming a mask for plating on both surfaces of the film substrate that covers the touch active area;
forming the plating layer on the transparent electrode layer exposed in the non-touch active area on both the surfaces of the film substrate;
removing the photoresist formed in the non-touch active area on both surfaces of the film substrate and the mask for plating formed in the touch active area on both surfaces of the film substrate;
simultaneously patterning the transparent electrode layer on both surfaces of the film substrate; and
removing the photoresist formed in the touch active area on both surfaces of the film substrate.

3. The method as claimed in claim 1, wherein forming the sensing electrodes and forming the outer lines includes:
coating a photoresist on both the surfaces of the film substrate, on which the transparent electrode layer is substantially entirely formed, patterning the photoresist, and then patterning the transparent electrode layer using the patterned photoresist as a mask;
removing the photoresist on both surfaces of the film substrate; and
forming the plating layer on the transparent electrode layer patterned in the non-touch active layer on both the surfaces of the film substrate.

4. The method as claimed in claim 1, wherein, forming the sensing electrodes and the forming of the outer lines includes simultaneously patterning the transparent electrode layer on both surfaces of the film substrate using a photolithography or printing technique.

5. The method as claimed in claim 1, wherein forming the sensing electrodes and forming the outer lines includes simultaneously patterning the transparent electrode layer on both surfaces of the film substrate and patterning the metal thin-film layer.

6. The method as claimed in claim 1, wherein patterning to the metal thin-film layer includes removing the metal thin-film layer on the sensing electrodes, after the transparent electrode layer and the metal thin-film layer are patterned.

7. The method as claimed in claim 1, further comprising forming a plurality of via holes that pass through the film substrate at one side of the film substrate corresponding to the non-touch active area.

8. The method as claimed in claim 7, wherein in one or more of forming the transparent electrode layer and forming the plating layer, one or more of the transparent electrode layer and the plating layer are grown on inner walls of the via holes such that both surfaces of the film substrate are connected to each other through the via holes.

9. The method as claimed in claim 1, wherein the metal thin-film layer is formed of:
an alloy of silver, palladium, and copper; or
at least one of molybdenum or aluminum alloy.

* * * * *